(12) United States Patent
Shiau et al.

(10) Patent No.: US 7,595,691 B2
(45) Date of Patent: Sep. 29, 2009

(54) PRE-AMPLIFIER FOR A RECEIVER AND A METHOD THEREFOR

(75) Inventors: Huei-Fang Shiau, Tainan County (TW); Chih-Haur Huang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 37 days.

(21) Appl. No.: 11/849,380

(22) Filed: Sep. 4, 2007

(65) Prior Publication Data

US 2009/0058528 A1    Mar. 5, 2009

(51) Int. Cl.
*H03F 3/45* (2006.01)
(52) U.S. Cl. ...................................... 330/258
(58) Field of Classification Search .................. 330/258; 327/563
See application file for complete search history.

(56) References Cited

U.S. PATENT DOCUMENTS

| | | | | |
|---|---|---|---|---|
| 4,532,479 A * | 7/1985 | Blauschild | .................. | 330/261 |
| 5,311,145 A * | 5/1994 | Huijsing et al. | ............. | 330/255 |
| 5,808,513 A * | 9/1998 | Archer | ........................ | 330/253 |
| 5,929,705 A * | 7/1999 | Zhang et al. | ................. | 330/253 |
| 6,160,424 A * | 12/2000 | Migliavacca | ................. | 327/65 |
| 6,400,219 B1 * | 6/2002 | Fayed | ............................. | 330/9 |
| 6,509,795 B1 * | 1/2003 | Ivanov | ........................ | 330/253 |
| 6,870,424 B2 * | 3/2005 | Pradhan et al. | ............. | 330/253 |
| 6,970,043 B2 * | 11/2005 | Pradhan et al. | ............. | 330/253 |
| 7,091,785 B2 * | 8/2006 | Deval et al. | .................. | 330/253 |
| 7,215,199 B2 * | 5/2007 | Marholev | ..................... | 330/258 |
| 7,307,477 B2 * | 12/2007 | Carreto et al. | .............. | 330/261 |
| 7,342,418 B2 * | 3/2008 | Moon | ........................... | 326/83 |
| 7,375,585 B2 * | 5/2008 | Trifonov et al. | ............. | 330/258 |
| 2008/0143439 A1 * | 6/2008 | Tanimoto et al. | ............ | 330/253 |
| 2008/0174342 A1 * | 7/2008 | Colbeck | ....................... | 327/64 |
| 2008/0258812 A1 * | 10/2008 | Khoury et al. | .............. | 330/253 |

\* cited by examiner

*Primary Examiner*—Steven J Mottola
(74) *Attorney, Agent, or Firm*—Thomas, Kayden, Horstemeyer & Risley

(57) ABSTRACT

A pre-amplifier for a receiver including first and second input operational amplifiers; an output module; and first and second feedforward circuits are provided. The input operational amplifiers amplify an input differential voltage pair to output a first and a second differential voltage pairs. The output module includes first and second output operational amplifiers and an inverter. The output operational amplifiers amplify the differential voltage pairs to output first and second output amplified voltages. The inverter pulls an output voltage high or low based on output amplified voltages. The first and second feedforward circuits are respectively for pulling up the first differential voltage pair or pulling down the second differential voltage pair, such that the first and the second output operational amplifiers are not disabled.

13 Claims, 6 Drawing Sheets

US 7,595,691 B2

PRE-AMPLIFIER FOR A RECEIVER AND A METHOD THEREFOR

BACKGROUND OF THE INVENTION

1. Field of the Invention

The invention relates in general to a pre-amplifier for a receiver, and more particularly to a pre-amplifier capable of pre-amplifying an input differential voltage pair with full-swing common-mode voltage range.

2. Description of the Related Art

The conventional pre-amplifier for a receiver is used to pre-amplify an input differential voltage pair to pull a digital signal high or low. When the common-mode voltage of the input differential voltage pair is too low or too high, the conventional pre-amplifier incorrectly outputs the digital signal, with the result that the post stage of the receiver malfunctions. Therefore, it is highly desirable to provide a pre-amplifier for a receiver with a full-swing common-mode voltage range.

SUMMARY OF THE INVENTION

The invention is directed to a pre-amplifier for a receiver. The pre-amplifier is applicable for the input differential voltage pair with the common-mode voltage ranging from the low supply voltage to the high supply voltage. Therefore, the pre-amplifier 100 in the embodiment has the full-swing common-mode voltage range.

According to a first aspect of the present invention, a pre-amplifier is provided. The pre-amplifier comprises a first and a second input operational amplifiers, an output module, a first and a second feedforward circuits. The first and the second input operational amplifiers amplify an input differential voltage pair to output a first and a second differential voltage pair. The transistors in the first and the second input operational amplifiers are complementary. The output module includes a first and a second operational amplifiers. The first output operational amplifier amplifies the first differential voltage pair to output one of the amplified first differential voltage pair. The outputted one is defined as a first output amplified voltage. The second output operational amplifier amplifies the second differential voltage pair to output one of the amplified second differential voltage pair. The outputted one is defined as a second output amplified voltage. The transistors in the first input and the first output operational amplifiers are complementary. The transistors in the second input and the second output operational amplifiers are complementary. The inverter pulls high or low an output voltage based on the first and the second output amplified voltages. The first feedforward circuit pulls up the first differential voltage pair when the common-mode voltage of the input differential voltage pair is higher than a first threshold, such that the first output amplifier is not disabled. The second feedforward circuit pulls down the second differential voltage pair when the common-mode voltage of the input differential voltage pair is lower than a second threshold, such that the second output amplifier is not disabled.

According to a second aspect of the present invention, a method for pre-amplifying an input differential voltage pair for a receiver is provided. The method is used in a pre-amplifier. The method includes: firstly, amplify an input differential voltage pair to output a first and a second differential voltage pairs respectively by a first and a second input operation amplifiers of the pre-amplifier. Next, pull the first differential voltage pair up when the common-mode voltage of the input differential voltage pair is higher than a first threshold, such that a first output operational amplifier of the pre-amplifier is not disabled. Pull the second differential voltage pair down when the common-mode voltage of the input differential voltage pair is lower than a second threshold, such that a second output operational amplifier of the pre-amplifier is not disabled. Next, amplify the first differential voltage pair to output one of the amplified first differential voltage pair. The outputted one is defined as a first output amplified voltage by the first output operational amplifier. Then, amplify the second differential voltage pair to output one of the amplified second differential voltage pair, where the outputted one is defined as a second output amplified voltage by the second output operational amplifier. Afterwards, pull an output voltage high or low based on the first and the second output amplified voltages. The transistors in the first and the second input operational amplifiers are complementary. The transistors in the first input and the first output operational amplifiers are complementary, while the transistors in the second input and the second output operational amplifiers are complementary.

The invention will become apparent from the following detailed description of the preferred but non-limiting embodiments. The following description is made with reference to the accompanying drawings.

DETAILED DESCRIPTION OF THE INVENTION

Figure 1:
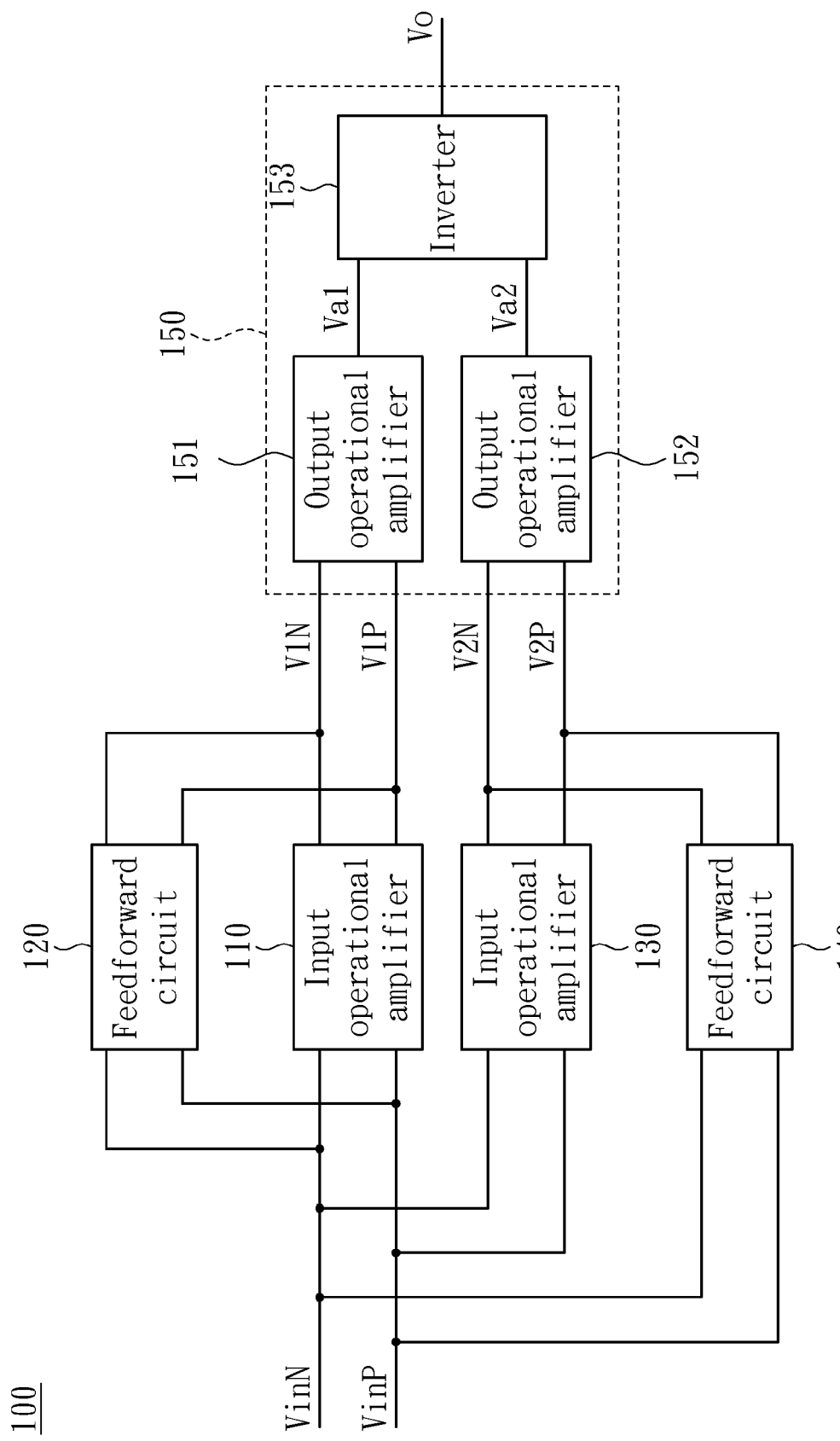
FIG. 1 shows a block diagram of the pre-amplifier for a receiver according to the embodiment of the invention.

FIG. 1 shows a block diagram of the pre-amplifier for a receiver according to the embodiment of the invention. Refer to FIG. 1. The pre-amplifier 100 includes input operational amplifiers 110 and 130, feedforward circuits 120 and 140, and an output module 150.

The input operational amplifiers 110 and 130 receive the input differential voltage pair VinN and VinP and amplify them to output a first differential voltage pair V1N and V1P from the input operational amplifier 110 and output a second differential voltage pair V2N and V2P from the input operational amplifier 130 to the output module 150. The transistors in the input operational amplifiers 110 and 130 are complementary.

The output module 150 includes output operational amplifiers 151 and 152, and an inverter 153. The output operational amplifier 151 receives and amplifies the first differential voltage pair V1N and V1P to output one differential voltage of the amplified first differential voltage pair to the inverter 153. The outputted differential voltage of the first differential voltage pair is defined as a first output amplified voltage Va1. The output operational amplifier 152 receives and amplifies the second differential voltage pair V2N and V2P to output one differential voltage of the amplified second differential voltage pair to the inverter 153. The outputted differential voltage is defined as a second output amplified voltage Va2. The inverter 153 pulls an output voltage Vo high or low based on the first and second output amplified voltages Va1 and Va2.

The transistors in the input operational amplifier 110 and the output operational amplifier 151 are complementary, as are the transistors in the input operational amplifier 130 and the output operational amplifier 152.

The feedforward circuits 120 and 140 also receive the input differential voltage pair VinN and VinP. When the common-mode voltage of the input differential voltage pair VinN and the VinP is higher than a first threshold, the feedforward circuit 120 pulls the first differential voltage pair V1N and V1P up, with the result that output operational amplifier 151 is not disabled. When the common-mode voltage of the input differential voltage pair VinN and VinP is lower than a second threshold, the feedforward circuit 140 pulls the second differential voltage pair V2N and V2P down, with the result that the output operational amplifier 152 is not disabled.

The detailed circuits and the function of the pre-amplifier 100 in the embodiment are described as follows. In this embodiment, the input operational amplifiers 110 and 130, the feedforward circuits 120 and 140, and the output module 150 are powered by the high supply voltage Vdd and the low supply voltage Vss.

Figure 2A:
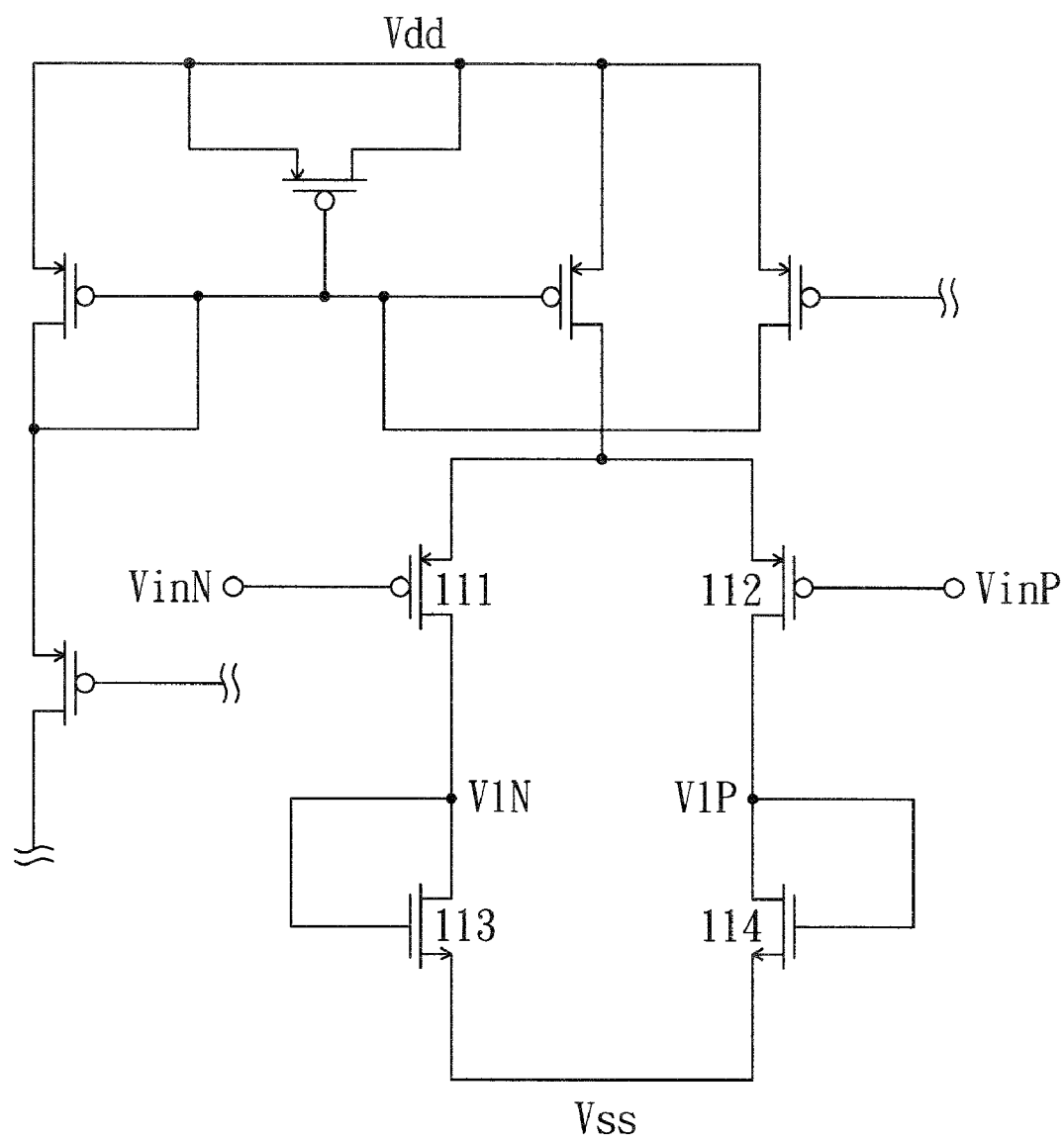
FIG. 2A shows the detailed circuit of the input operational amplifier in the embodiment.

FIG. 2A shows the detailed circuit of the input operational amplifier 110 in the embodiment. Referring to FIG. 2A, the input operational amplifier 110 includes transistors 111, 112, 113 and 114. The input operational amplifier 110 receives the input differential voltage pair VinN and VinP at the gates of transistors 111 and 112, and outputs the first differential voltage pair V1N and V1P at the gates of the transistors 113 and 114 accordingly.

Figure 2B:
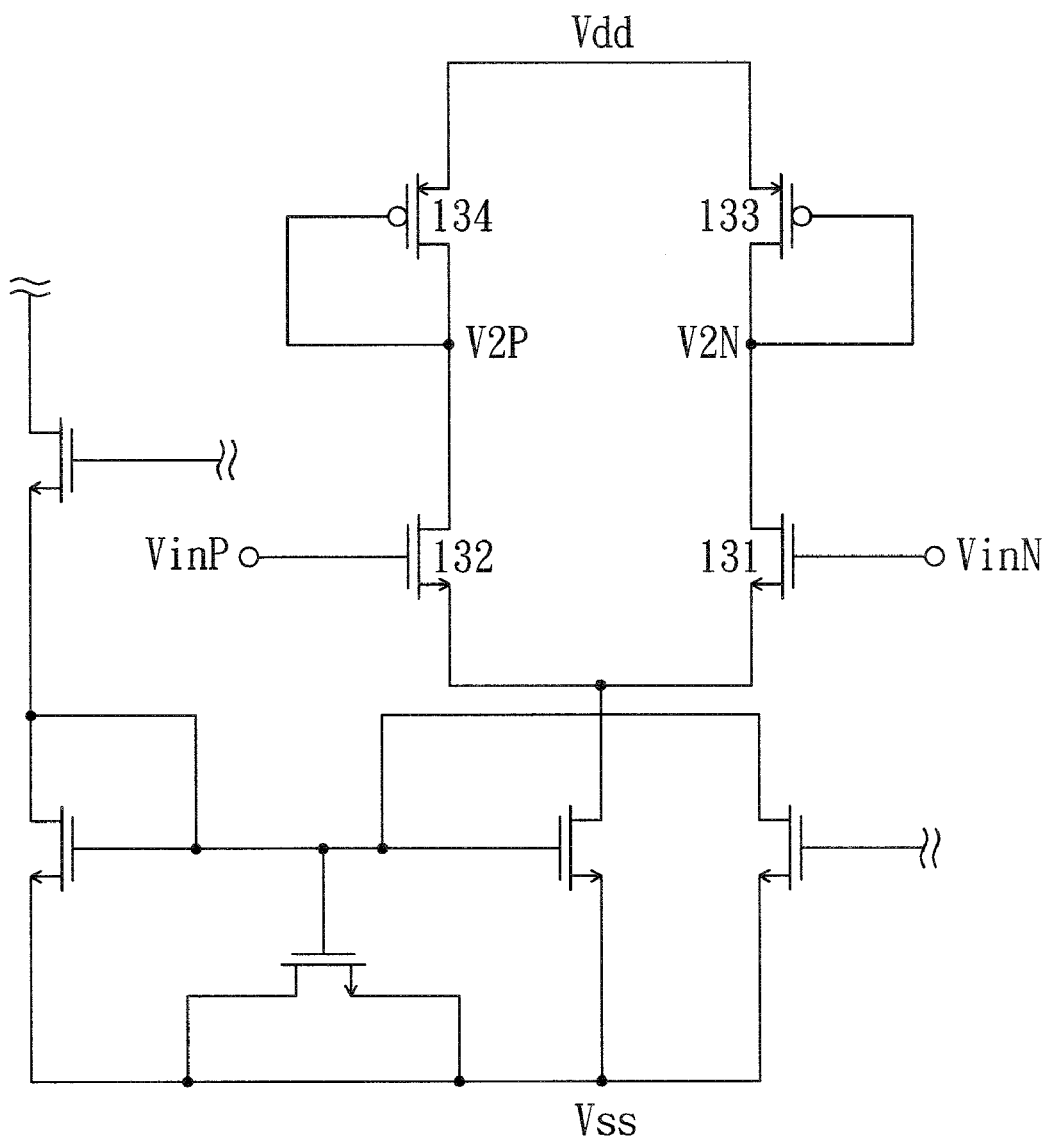
FIG. 2B shows the detailed circuit of the input operational amplifier in the embodiment.

FIG. 2B shows the detailed circuit of the input operational amplifier 130 in the embodiment. Referring to FIG. 2B, the input operational amplifier 130 includes transistors 131, 132 for receiving the input differential voltage pair VinN and VinP, and transistors 133 and 134 for outputting the first differential voltage pair V2N and V2P.

In this embodiment, the transistors 111 and 112 for receiving in the input operational amplifier 110 are PMOS, while the transistors 131 and 132 for receiving in the input operational amplifier 130 are NMOS. The transistors 113 and 114 for outputting from input operational amplifier 110 are NMOS, while the transistors 133 and 134 for outputting from input operational amplifier 130 are PMOS. The transistors in the input operational amplifiers 110 and 130 are complementary.

Figure 2C:
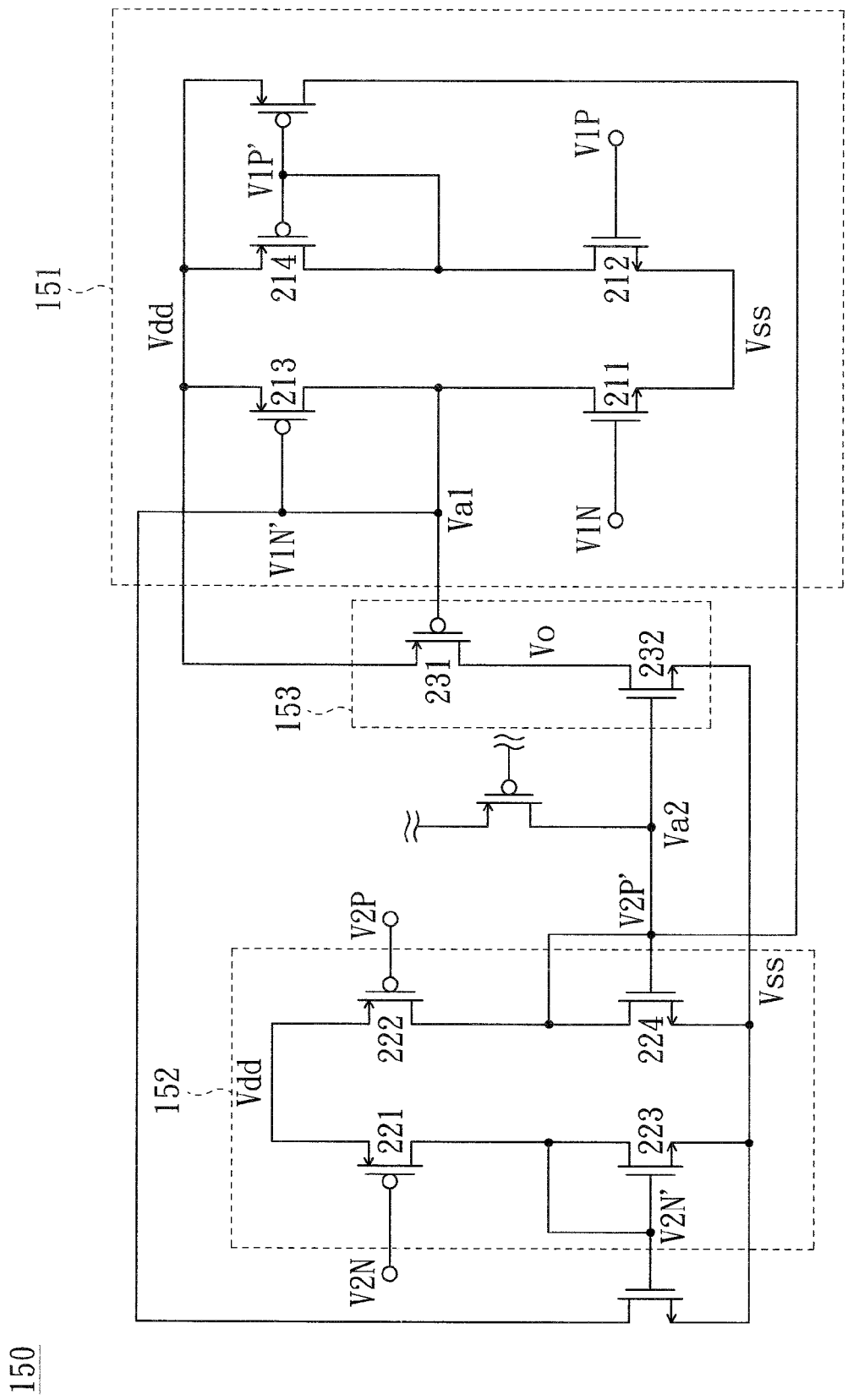
FIG. 2C shows the detailed circuit of the output module in the embodiment.

FIG. 2C shows the detail circuit of the output module 150 in the embodiment. In the embodiment, the output operational amplifier 151 in the output module 150 includes transistors 211, 212, 213 and 214, while the output operational amplifier 152 in the output module 150 includes transistors 221, 222, 223 and 224. The output operational amplifier 151 receives the first differential voltage pair V1N and V1P at the gates of transistors 211 and 212, obtains the amplified first differential voltage pair V1N' and V1P' at the gates of the transistors 213 and 214 accordingly, and outputs one of the amplified first differential voltage pair V1N' and V1P' as the first output amplified voltage Va1 to the inverter 153. In this embodiment, the voltage V1N' is outputted as the first output amplified voltage Va1.

In the embodiment, the output operational amplifier 152 includes transistors 221, 222, 223 and 224 with its circuit and function similar to the output operational amplifier 151. In this embodiment, the voltage V2P' of the second differential voltage pair is outputted as the second output amplified voltage Va2.

In the output operational amplifier 151 in this embodiment, the transistors 211 and 212 for receiving are NMOS, while the transistors 213 and 214 for outputting are PMOS. The transistors in the input and output operational amplifiers 110 and 151 are complementary, as are the transistors in the input and output operational amplifiers 130 and 152.

In the embodiment, the inverter 153 includes transistors 231 and 232. The transistors 231 and 232 receive the first and the second output amplified voltages Va1 and Va2, respectively, at their gates, and pull up or down the voltage at the connection between the drains of the transistors 231 and 232 based on the first and the second output amplified voltage Va1 and Va2 as the output voltage Vo.

Figure 2D:
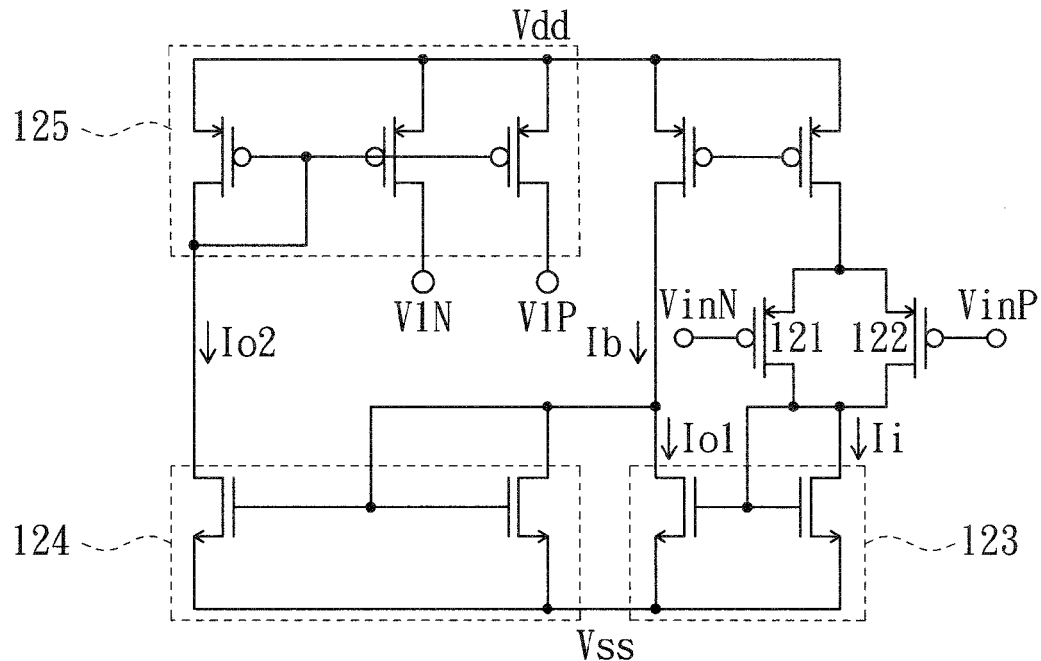
FIG. 2D shows the detailed circuit of the feedforward circuit in the embodiment.

FIG. 2D shows the detailed circuit of the feedforward circuit 120 in the embodiment. Referring to FIG. 2D, the feedforward circuit 120 in the embodiment includes an input transistor pair 121 and 122, current mirrors 123, 124, and a current mirror module 125.

Refer to FIG. 2D. The input transistor pair 121 and 122 receives the input differential voltage pair VinN and VinP at their gates. The input of the current mirror 123 is connected to the drains of the input transistor pair 121 and 122. The current mirror 124 is parallel-connected with the current mirror 123. The input of the current mirror 124 is connected to the output of the current mirror 123. The input of the current mirror module 125 is connected to the output of the current mirror 124. The outputs of the current mirror module 125 are connected to the transistors 113 and 114 in the input operational amplifier 110 in FIG. 2A. The voltages at the outputs of the current mirror module 125 are also defined as the first differential voltage pair V1N and V1P.

The function of the feedforward circuit 120 is now described as follows. In this embodiment, when the common-mode voltage is higher than the first threshold, input transistor pair 121 and 122 is turned off, so that the current mirror 123 is also disabled. Thus, a bias current Ib is inputted to the current mirror 124 rather than to the current mirror 123. In this embodiment, the first threshold is substantially equal to the high supply voltage Vdd minus the threshold voltage of transistors 121 and 122 in the feedforward circuit 120.

When receiving the bias current Ib, the current mirror 124 duplicates the bias current Ib to produce an output current Io2. The current mirror module 125 receives and duplicates the output current Io2 to produce two the output currents Io3 and Io4. The output current Io3 and Io4 pull up the voltages at the outputs of the current mirror module 125 by an amount equal to a source-gate cross voltage of the transistors in the current module 125, that is, it pulls up the first differential voltage pair V1N and V1P.

Therefore, the feedforward circuit 120 pulls up the first differential voltage pair V1N and V1P when the common-mode voltage of the input differential voltage VinN and VinP is higher than the first threshold.

In this embodiment, the input transistors 121 and 122 are biased by the bias current Ib. When the common-mode voltage of the input differential voltage pair VinN and VinP is not higher than the first threshold, the input transistor pair 121 and 122 is turned on to generate an input current Ii equal to the bias current Ib. The input current Ii is inputted to the current mirror 123. The current mirror 123 duplicates it to generate the output current Io1 equal to the bias current Ib. That is, the bias current Ib flows into the current mirror 123 rather than flowing into the current mirror 124.

Therefore, the current mirror 124 is disabled, with the result that the current mirror module 125 is disabled. The voltages at the outputs of the current mirror module are kept unchanged. That is, the feedforward circuit 120 keeps the first differential voltage pair V1N and V1P unchanged when the common-mode voltage of the input differential voltage pair is not higher than the first threshold.

The effect of the feedforward circuit 120 is explained in the following. Refer to FIG. 2A, 2C and 2D. In FIG. 2A, when the common-mode voltage of the input differential voltage pair VinN and VinP is higher than the first threshold, the transistors 111 and 112 are turned off. Therefore, the first differential voltage pair V1N and V1P at the gate of the transistors 113 and 114 is close to the low supply voltage Vss, which may turns the transistors 211 and 212 in the output operational amplifier 151 in FIG. 20 off. If the transistors 211 and 212 are turned off, the output amplified voltage Va1 is kept high no matter whether the input differential voltage VinN is higher or lower than the input differential VinP. The inverter 130 may thus produce the output voltage Vo incorrectly. The duty cycle of the output voltage Vo is also not correct.

Therefore, in the embodiment, when the common-mode voltage of the input differential voltage pair VinN and VinP is higher than the first threshold, feedforward circuit 120 in FIG. 2D is used to pull up the first differential voltage pair V1N and V1P by the an amount equal to the source-gate cross voltage of the transistors in the current mirror module 125. By pulling up the first differential voltage pair V1N and V1P, the transistors 211 and 212 in the output operational amplifier 151 in FIG. 2C are turned on. The output operational amplifier 151 is thus not disabled and works properly.

When the common-mode voltage of the input differential voltage pair VinN and VinP is not higher than the first threshold, the transistors 111 and 112 in the input operational amplifier 110 in FIG. 2A are turned on and the transistors 113 and 114 output the first differential voltage pair V1N and V1P which is not close to the low supply voltage Vss. The output operational amplifier 151 is not disabled. Therefore, the first differential voltage pair V1N and V1P need not be pulled high. The feedforward circuit 120 keeps the first differential voltage pair V1N and V1P unchanged.

As the operational amplifiers 151 and 152 are not disabled, the inverter 153 pulls high or low the output voltage Vo based on the output amplified voltages Va1 and Va2 outputted by operational amplifiers 151 and 152. Therefore, the duty cycle of the output voltage Vo is obtained precisely. Hence, with the feedforward circuit 120, the pre-amplifier 100 is capable of pre-amplifying the input differential voltage pair VinN and VinP to generate the output voltage Vo even if its common-mode voltage is too high.

Figure 2E:
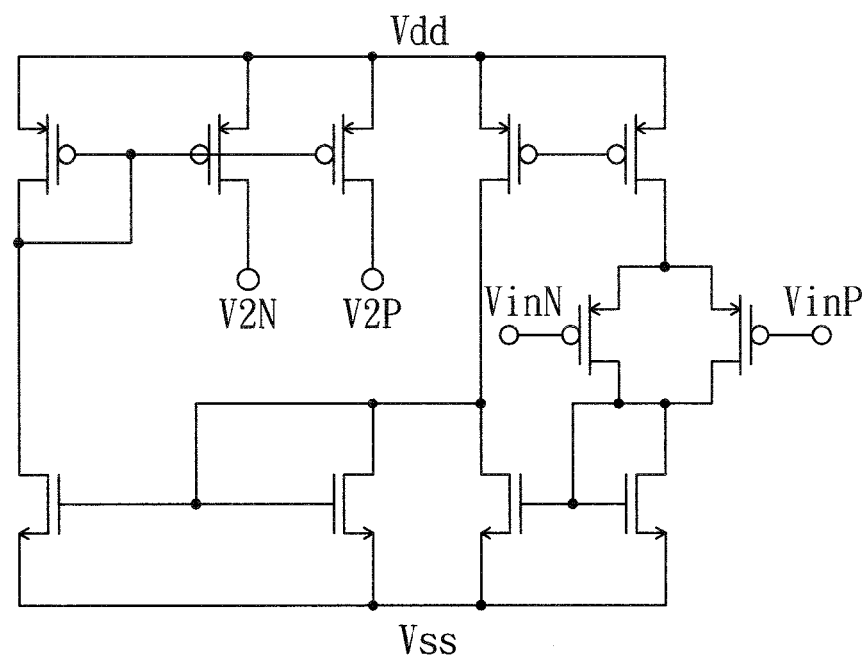
FIG. 2E shows the detailed circuit of the feedforward circuit 140 in the embodiment.

FIG. 2E shows the detailed circuit of the feedforward circuit 140 in the embodiment. The feedforward circuit 140 is similar to the feedforward circuit 120 and a detailed description is therefore omitted. The transistors in the feedforward circuits 120 and 140 are complementary. In this embodiment, when the common-mode voltage of the input differential voltage VinN and VinP is lower than the second threshold, the feedforward circuit 140 is used to pull down the second differential voltage pair V2N and V2P, with the result that the output operational amplifier 152 is not disabled. When the common-mode voltage of the input differential voltage VinN and VinP is not lower than the second threshold, the feedforward circuit 140 keeps the second differential voltage pair V2N and V2P unchanged.

In this embodiment, the second threshold is substantially equal to the low supply voltage Vss plus the threshold voltage of the transistors for receiving the input differential voltage pair VinN and VinP in feedforward circuit 140.

Therefore, with feedforward circuit 140, output operational amplifier 152 is not disabled even if the common-mode voltage of the input differential voltage pair is too low. Therefore, pre-amplifier 100 is capable of pre-amplifying the input differential voltage pair VinN and VinP to properly pull the output voltage Vo high or low. The duty cycle of the output voltage Vo is obtain precisely.

In the embodiment, when the common-mode voltage of the input differential voltage pair is too high or too low, the feedforward circuits 120 or 140 can be used to pull up or down the first or the second differential voltage pairs to prevent the output operational amplifiers from being disabled, with the result that the output voltage Vo is able to be pulled high or low properly. The pre-amplifier 100 in the embodiment is applicable for the input differential voltage pair with the common-mode voltage ranging from the low supply voltage Vss to the high supply voltage Vdd. Therefore, the pre-amplifier 100 in the embodiment has a full-swing common-mode voltage range.

Figure 3:
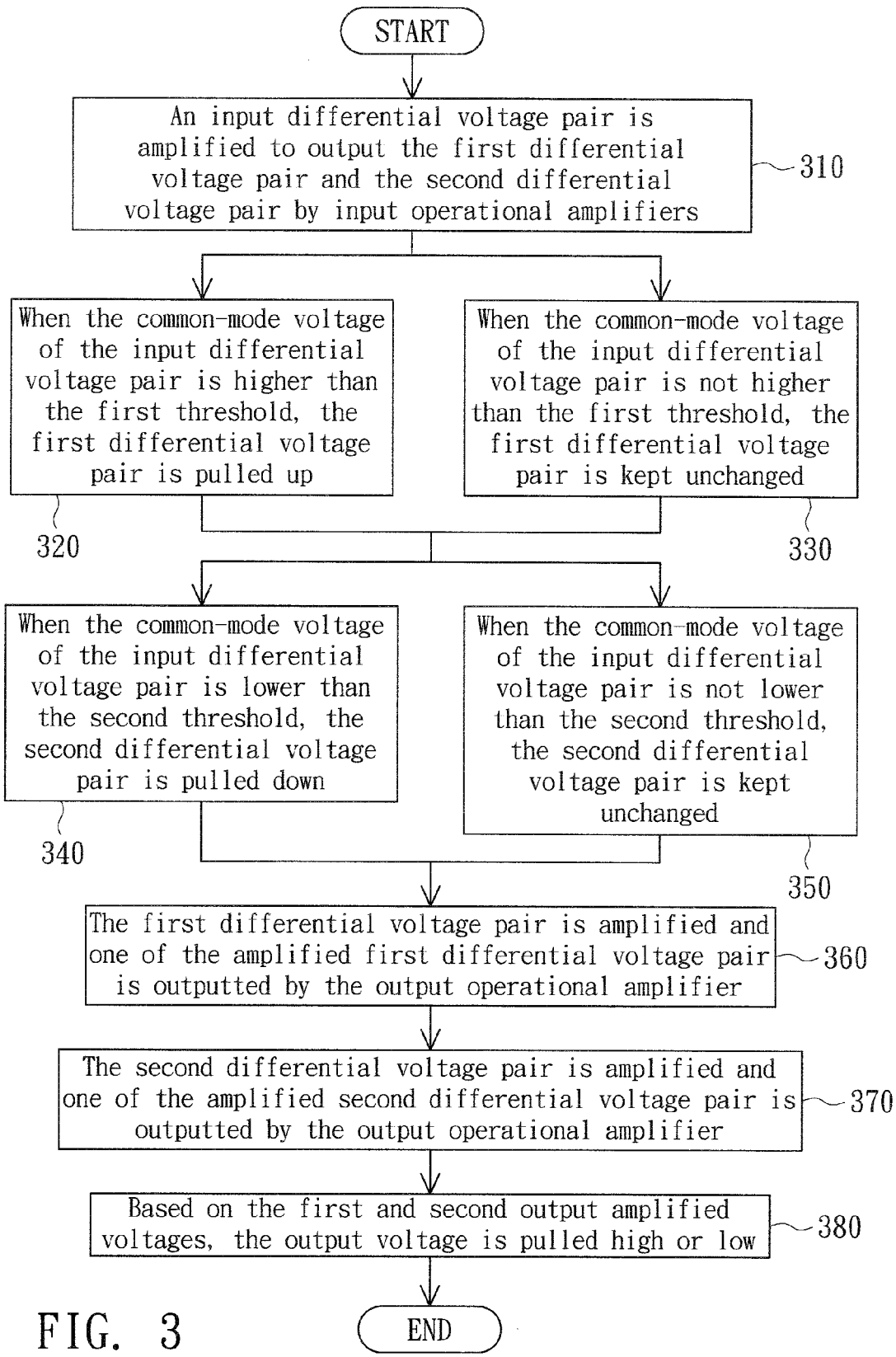
FIG. 3 shows a flow chart of a method for pre-amplifying the input differential voltage pair for a receiver in the embodiment.

FIG. 3 shows a flow chart of a method for pre-amplifying the input differential voltage pair VinN and VinP for a receiver in the embodiment. The method is used in pre-amplifier 100. Refer to FIG. 3. In step 310, the input differential voltage pair VinN and VinP is amplified to output the first differential voltage pair V1N and V1P and the second differential voltage pair V2N and V2P by the input operational amplifiers 110 and 130.

Next, the first and the second differential voltage pairs are pulled up or down or kept unchanged, with the result that output operational amplifiers 151 and 152 are not disabled.

Step 320 and 330 correspond to the first differential voltage pair V1N and V1P. In step 320, when the common-mode voltage of the input differential voltage pair VinN and VinP is higher than the first threshold, the first differential voltage pair V1N and V1P is pulled up, with the result that output operational amplifier 151 is not disabled.

In step 330, the first differential voltage pair V1N and V1P is kept unchanged when the common-mode voltage of the input differential voltage pair VinN and VinP is not higher than the first threshold.

Step 340 and 350 correspond to the second differential voltage pair V2N and V2P. In step 340, when the common-mode voltage of the input differential voltage pair VinN and VinP is lower than the second threshold, the second differential voltage pair V2N and V2P is pulled down, with the result that the second output operational amplifier 152 is not disabled.

In step 350, the second differential voltage pair V2N and V2P is kept unchanged when the common-mode voltage of the input differential voltage pair VinN and VinP is not lower than the second threshold.

In step 360, the first differential voltage pair V1N and V1P is amplified and one of the amplified first differential voltage pair V1N' and V1P' is outputted by the output operational amplifier 151. The outputted one of the voltage pair V1N' and V1P' is defined as the first output amplified voltage Va1.

In step 370, the second differential voltage pair V2N and V2P is amplified and one of the amplified second differential voltage pair V2N' and V2P' is outputted by the output operational amplifier 152. The outputted one of the voltage pair V2N' and V2P' is defined as the second output amplified voltage Va2.

Next in step 380, based on the first and second output amplified voltages Va1 and Va2, the output voltage Vo is pulled high or low.

In the embodiment, when the common-mode voltage of the input differential voltage pair is too high or too low, the method pulls the first or the second differential voltage pairs up or down to prevent the output operational amplifiers from being disabled. Therefore, by applying the method according to the embodiment, the input differential voltage pair with the common-mode voltage ranging from the lower supply voltage Vss to the high supply voltage Vdd is able to be pre-amplified to generate the output voltage with precise duty cycle.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pre-amplifier for a receiver, the pre-amplifier comprising:
    a first input operational amplifier and a second input operational amplifier for amplifying an input differential voltage pair to respectively output a first differential voltage pair and a second differential voltage pair, the transistors in the first and the second input operational amplifiers being complementary;
    an output module comprising:
        a first output operational amplifier for amplifying the first differential voltage pair to output one of the amplified first differential voltage pair, the outputted one being defined as a first output amplified voltage;
        a second output operational amplifier for amplifying the second differential voltage pair to output one of the amplified second differential voltage pair, the outputted one being defined as a second output amplified voltage, the transistors in the first input and the first output operational amplifiers being complementary, the transistors in the second input and the second output operational amplifiers being complementary; and
        an inverter for pulling an output voltage high or low based on the first and the second output amplified voltages;
    a first feedforward circuit for pulling the first differential voltage pair up when the common-mode voltage of the input differential voltage pair is higher than a first threshold, such that the first output amplifier is not disabled; and
    a second feedforward circuit for pulling the second differential voltage pair down when the common-mode voltage of the input differential voltage pair is lower than a second threshold, such that the second output amplifier is not disabled.

2. The pre-amplifier according to claim 1, wherein the first feedforward circuit keeps the first differential voltage pair unchanged when the common-mode voltage of the input differential voltage pair is not higher than the first threshold.

3. The pre-amplifier according to claim 1, wherein the second feedforward circuit keeps the second differential voltage pair unchanged when the common-mode voltage of the input differential voltage pair is not lower than the second threshold.

4. The pre-amplifier according to claim 1, wherein the transistors in the first and the second feedforward circuits are complementary.

5. The pre-amplifier according to claim 1, wherein the first feedforward circuit comprises:

an input transistor pair, for receiving the input differential voltage pair, when the input differential voltage pair is higher than the first threshold, the input transistor pair being turned off;
a first current mirror, when the input differential voltage pair is higher than the first threshold, the first current mirror being disabled;
a second current mirror, parallel-connected with the first current mirror, for duplicating a bias current to generate a second output current when the input differential voltage pair is higher than the first threshold; and
a current mirror module, for duplicating the second output current to generate a third output current and a fourth output current when the input differential voltage pair is higher than the first threshold, so as to pull the voltages at the outputs of the current mirror module up;
wherein the voltages at the outputs of the current mirror module are defined as the first differential voltage pair.

6. The pre-amplifier according to claim 5, wherein when the input differential voltage pair is not higher than the first threshold, the input transistor pair is biased by the bias current and is turned on to generate an input current equal to the bias current, the first current mirror duplicating the input current to generate the first output current, the second current mirror and the current mirror module are disabled, such that the first differential voltage pair is kept unchanged.

7. The pre-amplifier according to claim 1, the second feedforward circuit comprises:
    an input transistor pair, for receiving the input differential voltage pair, when the input differential voltage pair is lower than the second threshold, the input transistor pair being turned off;
    a first current mirror, when the input differential voltage pair is lower than the second threshold, the first current mirror being disabled;
    a second current mirror, parallel-connected with the first current mirror, for duplicating a bias current to generate a second output current when the input differential voltage pair is higher than the first threshold; and
    a current mirror module for duplicating the second output current to generate a third output current and a fourth output current when the input differential voltage pair is lower than the second threshold, so as to pull the voltages at the outputs of the current mirror module down;
    wherein the voltages at the outputs of the current mirror module are defined as the second differential voltage pair.

8. The pre-amplifier according to claim 7, wherein when the input differential voltage pair is not lower than the second threshold, the input transistor pair is biased by the bias current and is turned on to generate an input current equal to the bias current, the first current mirror duplicating the input current to generate the first output current, the second current mirror and the current mirror module are disabled, such that the second differential voltage pair is kept unchanged.

9. The pre-amplifier according to claim 1, wherein the pre-amplifier is powered by a high supply voltage and a low supply voltage, the first threshold substantially equals to the high supply voltage minus a threshold voltage of a transistor in the first feedforward circuit, the second threshold substantially equals to the low supply voltage plus a threshold voltage of a transistor in the second feedforward circuit.

10. A method for pre-amplifying an input differential voltage pair for a receiver, used in a pre-amplifier, the method comprising:

amplifying an input differential voltage pair to output a first and a second differential voltage pairs respectively by a first and a second input operational amplifiers of the pre-amplifier;

pulling the first differential voltage pair up when the common-mode voltage of the input differential voltage pair is higher than a first threshold, such that a first output operational amplifier of the pre-amplifier is not disabled;

pulling the second differential down voltage pair when the common-mode voltage of the input differential voltage pair is lower than a second threshold, such that a second output operational amplifier of the pre-amplifier is not disabled;

amplifying the first differential voltage pair to output one of the amplified first differential voltage pair by the first output operational amplifier, the outputted one being defined as a first output amplified voltage;

amplifying the second differential voltage pair to output one of the amplified second differential voltage pair by the second output operational amplifier, the outputted one being defined as a second output amplified voltage; and pulling an output voltage high or low based on the first and the second output amplified voltages;

wherein the transistors in the first and the second input operational amplifiers are complementary;

wherein the transistors in the first input and the first output operational amplifiers are complementary, while the transistors in the second input and the second output operational amplifiers are complementary.

11. The method according to claim 10, wherein the method further comprises:

keeping the first differential voltage pair unchanged when the common-mode voltage of the input differential voltage pair is not higher than the first threshold.

12. The method according to claim 10, wherein the method further comprises:

keeping the second differential voltage pair unchanged when the common-mode voltage of the input differential voltage pair is not lower than the second threshold.

13. The method according to claim 10, wherein the pre-amplifier is powered by a high supply voltage and a low supply voltage, the first threshold is substantially equal to the high supply voltage minus a threshold voltage of a transistor in a first feedforward circuit, the second threshold substantially equals to the low supply voltage plus a threshold voltage of a transistor in a second feedforward circuit.

* * * * *